United States Patent [19]

Krause

[11] Patent Number: 6,157,589
[45] Date of Patent: Dec. 5, 2000

[54] DYNAMIC SEMICONDUCTOR MEMORY DEVICE AND METHOD FOR INITIALIZING A DYNAMIC SEMICONDUCTOR MEMORY DEVICE

[75] Inventor: Gunnar Krause, Munich, Germany

[73] Assignee: Siemens Aktiengesellschaft, Munich, Germany

[21] Appl. No.: 09/343,431

[22] Filed: Jun. 30, 1999

[30] Foreign Application Priority Data

Jun. 30, 1998 [DE] Germany .......................... 198 29 287

[51] Int. Cl.$^7$ ...................................... G11C 8/00
[52] U.S. Cl. ........................................ 365/226; 365/228
[58] Field of Search .................... 365/226, 227, 365/228

[56] References Cited

U.S. PATENT DOCUMENTS 5,307,319  4/1994  Kohketsu et al. .
5,841,724  11/1998 Ebel et al. ............................. 365/226
5,894,446  4/1999  Itou ..................................... 365/222

FOREIGN PATENT DOCUMENTS 0 797 207 A2  9/1997  European Pat. Off. .
9-106668      4/1997  Japan .

*Primary Examiner*—Vu A. Le
*Attorney, Agent, or Firm*—Herbert L. Lerner; Laurence A. Greenber; Werner H. Stemer

[57] ABSTRACT

A dynamic semiconductor memory device of a random access type has an initialization circuit that controls the switching-on operation of the semiconductor memory device and of its circuit components. The initialization circuit supplies a supply voltage stable signal once the supply voltage has been stabilized after the switching-on of the semiconductor memory device. The initialization circuit has an enable circuit that receives the supply voltage stable signal and further command signals externally applied to the semiconductor memory device. The enable circuit supplies an enable signal after a predetermined proper initialization sequence of the command signals applied to the semiconductor memory device is identified. The enable signal effects the unlatching of a control circuit provided for the proper operation of the semiconductor memory device.

13 Claims, 3 Drawing Sheets

DYNAMIC SEMICONDUCTOR MEMORY DEVICE AND METHOD FOR INITIALIZING A DYNAMIC SEMICONDUCTOR MEMORY DEVICE

BACKGROUND OF THE INVENTION

Field of the Invention

The invention relates to a dynamic semiconductor memory device of the random access type (DRAM/ SDRAM) having an initialization circuit which controls a switching-on operation of the semiconductor memory device and of its circuit components. The initialization circuit supplies a supply voltage stable signal (POWERON) once a supply voltage has been stabilized after the switching-on of the semiconductor memory device. The invention also relates to a method for initializing such a dynamic semiconductor memory device, and also to the use of an enable circuit, that supplies an enable signal, for controlling the switching-on operation of the dynamic semiconductor memory device.

In the case of SDRAM semiconductor memories according to the JEDEC standard, it is necessary to ensure during the switch-on operation ("POWERUP") that the internal control circuits provided for the proper operation of the semiconductor memory device are reliably held in a defined desired state, in order to prevent undesirable activation of output transistors that would cause, on the data lines, a short circuit (so-called "bus contention" or "data contention") or uncontrolled activation of internal current loads. The solution to the problem turns out to be difficult on account of a fundamental unpredictability of the time characteristic of the supply voltage and of the voltage level or levels at the external control inputs during the switch-on operation of the semiconductor memory. According to the specifications of the manufacturer an SDRAM component should ignore all commands which are present chronologically before a defined initialization sequence. The sequence consists of predetermined commands that must be applied in a defined chronological order. However, a series of functions and commands which are allowed during proper operation of the component are desired or allowed chronologically only after the initialization sequence. According to the JEDEC standard for SDRAM semiconductor memories, a recommended initialization sequence (so-called "POWERON-SEQUENCE") is provided as follows:

a. the application of a supply voltage and a start pulse in order to maintain an NOP condition at the inputs of the component;

b. the maintenance of a stable supply voltage of a stable clock signal, and of stable NOP input conditions for a minimum time period of 200 us;

c. the preparation command for word line activation (PRECHARGE) for all the memory banks of the device;

4. the activation of eight or more refresh commands (AUTOREFRESH); and 5. the activation of a loading configuration register command (MODE-REGISTER-SET) for initializing the mode register.

After the identification of such a defined initialization sequence, the memory module is normally in a so-called IDLE state, that is to say it is precharged and prepared for proper operation. In the case of the SDRAM semiconductor memory modules that have been disclosed to date, all the control circuits of the component have been unlatched only with the POWERON signal. The signal POWERON is active if the internal supply voltages have reached the necessary values that are necessary for the proper operation of the component. The module is then in a position to recognize and execute instructions.

SUMMARY OF THE INVENTION

It is accordingly an object of the invention to provide a dynamic semiconductor memory device and a method for initializing a dynamic semiconductor memory device which overcome the above-mentioned disadvantages of the prior art methods and devices of this general type, which is as simple as possible in structural terms and which effectively prevents the risk of a short circuit of the data lines and/or of uncontrolled activation of internal current loads.

With the foregoing and other objects in view there is provided, in accordance with the invention, a dynamic semiconductor memory device of a random access type, containing an initialization circuit controlling a switching-on operation and supplying a supply voltage stable signal once a supply voltage has been stabilized after the switching-on operation. The initialization circuit has a control circuit for controlling operations and an enable circuit receiving the supply voltage stable signal and externally applied further command signals. The enable circuit outputting an enable signal after a predetermined proper initialization sequence of the externally applied further command signals are identified and the enable signal effecting an unlatching of the control circuit.

The invention provides for the initialization circuit to have an enable circuit, which receives the supply voltage stable signal and the externally applied further command signals. The enable circuit generates the enable signal after the identification of the predetermined proper initialization sequence of the command signals is achieved. The enable signal effects the unlatching of the control circuit provided for the proper operation of the semiconductor memory device.

Following the principle of the invention, the enable signal (CHIPREADY) is generated and becomes active in dependence on further internal signals and the initialization sequence and then unlatches predetermined circuits. The predetermined circuits remain latched until the end of the predetermined initialization sequence. By way of example, commands are decoded but not executed and the output drivers are held at high impedance.

According to the preferred application in SDRAM memory devices according to the JEDEC standard, it is provided that the command signals, externally applied to the semiconductor memory device, of the initialization sequence are to be identified by the enable circuit. The command signals include a preparation command signal for word line activation (PRECHARGE), and/or a refresh command signal (AUTOREFRESH), and/or a loading configuration register command signal (MODE-REGISTER-SET).

According to an advantageous structural refinement of the initialization circuit according to the invention, it is provided that the enable circuit has at least one bistable multivibrator stage with a set input which receives the command signal (PRECHARGE, AUTOREFRESH, MODE-REGISTER-SET). The bistable multivibrator also has a reset input to which the supply voltage stable signal (POWERON), a signal derived therefrom, or a linked signal is applied. The bistable multivibrator further has an output at which the enable signal (CHIPREADY) is outputted.

In particular, the enable circuit has a plurality of bistable multivibrator stages respectively receiving the command signals.

In an expedient refinement of the invention, it is provided that the output of at least one of the bistable multivibrator stages is passed to a reset input of a further multivibrator stage. In this case, it may furthermore be provided that, in one of the bistable multivibrator stages, the supply voltage stable signal (POWERON) and the signal output from the output of the further multivibrator stage are passed, after having been logically combined by a gate, to the reset input of the multivibrator stage.

Other features which are considered as characteristic for the invention are set forth in the appended claims.

Although the invention is illustrated and described herein as embodied in a dynamic semiconductor memory device and a method for initializing a dynamic semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
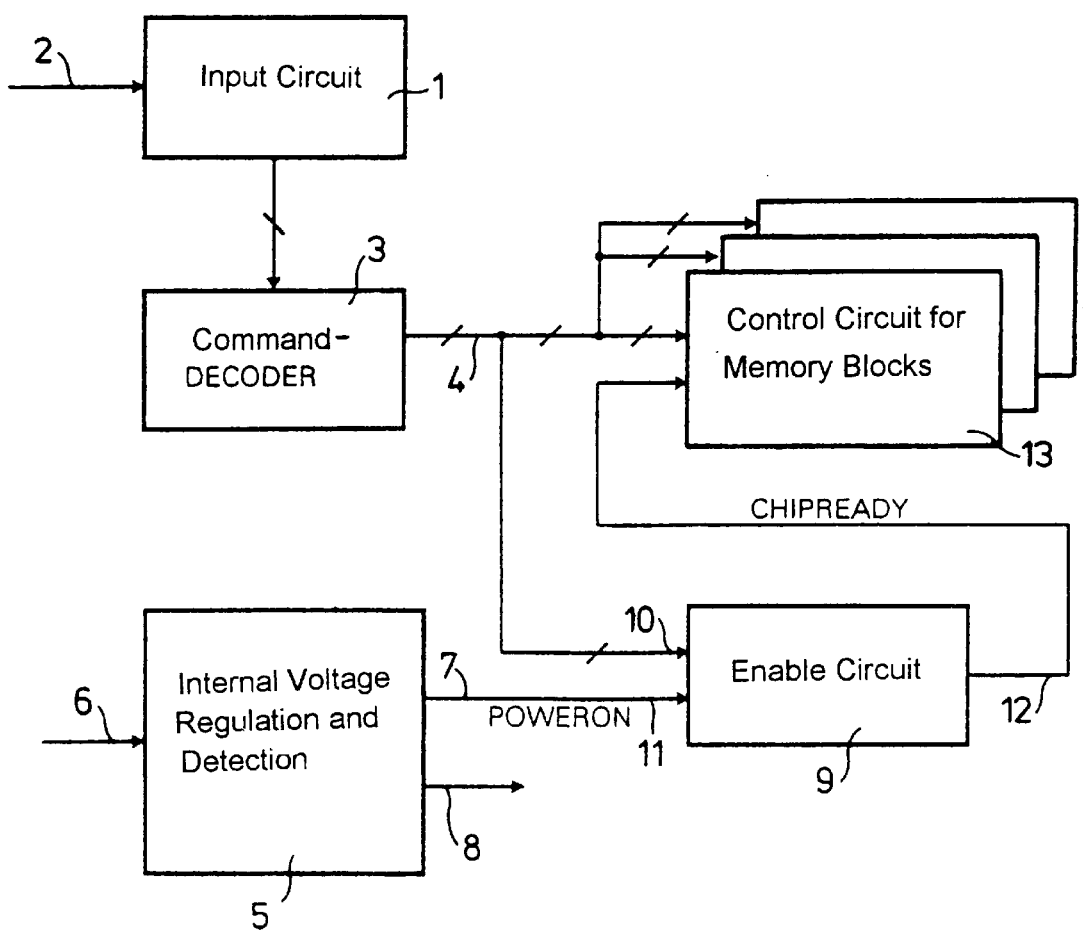
FIG. 1 is a diagrammatic, block diagram of components of an initialization circuit which controls a switching-on operation of a semiconductor memory and its circuit components according to the invention.

In all the figures of the drawing, sub-features and integral parts that correspond to one another bear the same reference symbol in each case. Referring now to the figures of the drawing in detail and first, particularly, to FIG. 1 thereof, there are shown circuit components, important for understanding the invention, of an SDRAM memory device operating according to the JEDEC standard. The circuit components include an initialization circuit controlling a switching-on operation of the SDRAM memory device and its circuit components. The initialization circuit has an input circuit 1, to whose input 2 command and clock signals that are externally applied in reference to the semiconductor memory are provided. The command and clock signals are amplified and conditioned before being received by a command decoder 3 connected downstream of the input circuit 1 and at whose output 4, inter alia, the command signals PRE or PRECHARGE (preparation command for word line activation), ARF or AUTOREFRESH (refresh command) and MRS or MODE-REGISTER-SET (loading configuration register command) are output. The initialization circuit further has a circuit 5 for internal voltage regulation and/or detection, at whose input 6 the external supply voltages that are externally applied to the semiconductor memory externally are fed in. The circuit 5 has a first output 7 outputting a POWERON signal and a second output 8 supplying stabilized internal supply voltages. The method of operation and the structure of the circuits 1, 3 and 5 are sufficiently known to the person skilled in the art and therefore do not need to be explained in any more detail. What is important for understanding the invention is the fact that the circuit 5 supplies an active POWERON signal if, after the POWERUP phase of the SDRAM memory, the internal supply voltages present at the output 8 have reached the values necessary for proper operation of the component.

According to the invention, the initialization circuit furthermore has an enable circuit 9 connected downstream of the circuits 3 and 5. The command signals PRE, ARF and MRS are applied to an input 10 of the enable circuit 9 and the POWERON signal is applied to an input 11 of the enable circuit 9. An enable signal CHIPREADY is supplied at an output 12 of the enable circuit 9 after the identification of a predetermined proper initialization sequence of the command signals applied to the semiconductor memory device is achieved. The enable signal effects unlatching of control circuits 13 provided for proper operation of the semiconductor memory device. The internal control circuits 13 serve inter alia for sequence control for one or more of the memory blocks of the SDRAM memory and are known as such.

Figure 2:
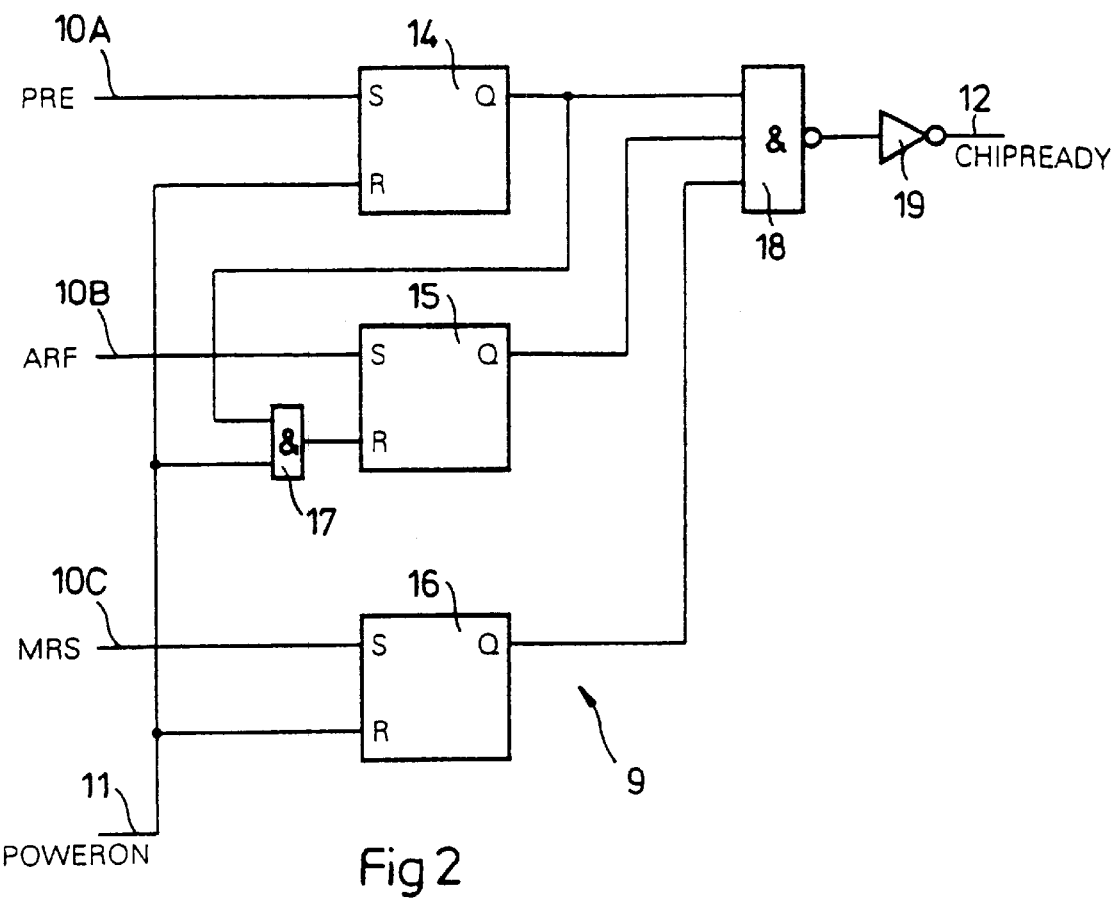
FIG. 2 is circuit diagram of an enable circuit that supplies an enable signal (CHIPREADY)

FIG. 2 shows a preferred exemplary embodiment of the enable circuit 9 according to the invention. The enable circuit 9 contains three bistable multivibrator stages 14, 15 and 16 each having a set input S, a reset input R, and also an output Q. An AND gate 17 connected upstream of the reset input R of the multivibrator stage 15 and an AND gate 18 connected downstream of all the outputs Q of the multivibrator stages 14, 15, 16 are further provided. The enable circuit further has an inverter 19 connected downstream of the AND gate 18. The enable signal CHIPREADY being output at the output 12 of the inverter 19 and the enable signal CHIPREADY is active HIGH, that is to say activated when its voltage level is at logic HIGH. The command signals PRE, ARF, MRS applied to the respective set inputs S of the bistable multivibrator stages 14, 15, 16 are each active LOW, that is to say these signals are active when their voltage level is at logic LOW, while the POWERON signal is again active HIGH. The POWERON signal is applied directly to the reset inputs R in the case of the multivibrator stages 14 and 16 and is firstly applied to one input of the AND gate 17 in the case of the multivibrator stage 15, the signal output from the output Q of the multivibrator stage 14 is applied to the other input of the AND gate 17, the output of the AND gate 17 is connected to the reset input of the multivibrator stage 15.

The method of operation of the enable circuit 9 illustrated in FIG. 2 is such that activation of the enable signal CHIPREADY at is the output 12 to logic HIGH is generated only when a predetermined chronological initialization sequence of the command signals PRE, ARF and MRS and activation of the POWERON signal to the logic level HIGH are detected. Only then are the control circuits 13 unlatched on account of the activation of the enable signal CHIPREADY; the control circuits 13 remaining latched prior to this.

Figure 3:
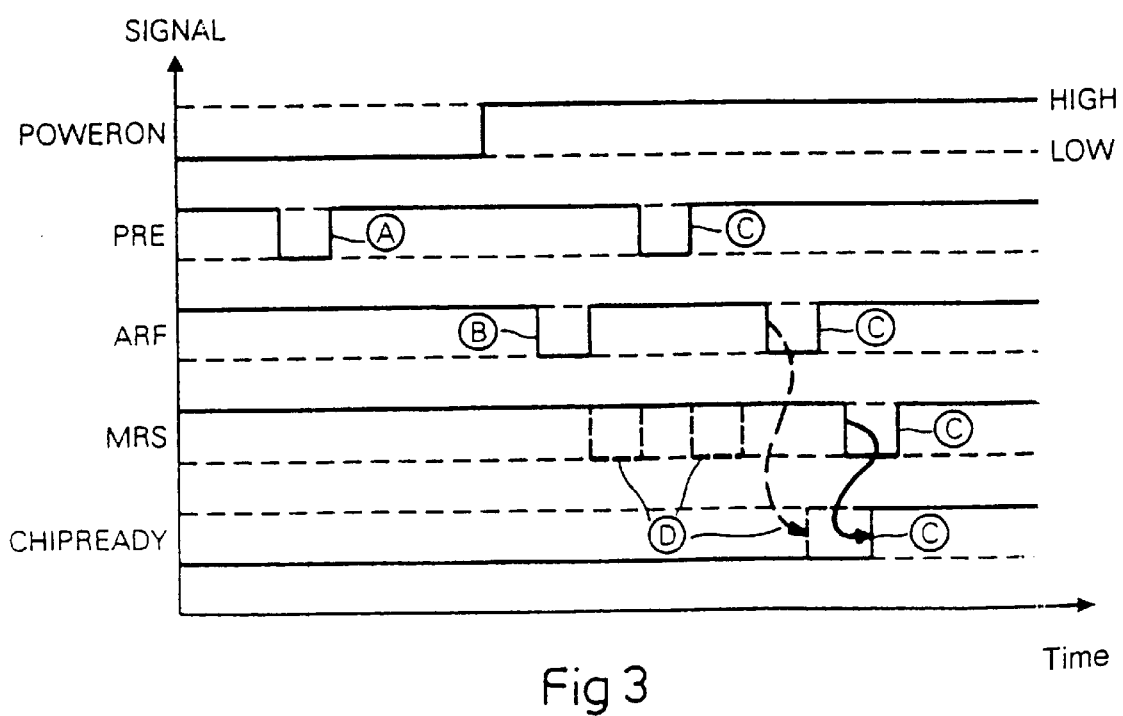
FIG. 3 is a time sequence diagram for elucidating a method of operation of the circuit according to FIG. 2.

In the schematic time sequence diagram according to FIG. 3, exemplary command sequences during the switching-on operation of the semiconductor memory device are illustrated in order to elucidate the method of operation of the enable circuit 9. In the case situation A, the signal PRECHARGE is activated to active LOW too early relative to the activation of the POWERON signal, with the result that, the enable signal CHIPREADY is not yet activated to logic HIGH since the proper initialization sequence requires a waiting time before the first command. The signal swing of the command PRECHARGE according to case situation A is thus correctly ignored. In case situation B, the chronological order of the activation of the signal AUTOREFRESH to logic LOW is incorrect since the proper initialization sequence prescribes a previous PRECHARGE command before the AUTOREFRESH command. The signal swing of the AUTOREFRESH signal to logic LOW according to case situation B is therefore likewise ignored, and the enable signal does not go to logic HIGH. In case situation C, a correct chronological order of the commands PRECHARGE, AUTOREFRESH, MODE-REGISTER-SET is present conforming to the JEDEC standard, in a logically consistent manner, since the POWERON signal is also at logic HIGH, an enable signal CHIPREADY at logic HIGH is now supplied. Illustrated using dashed lines, another further conceivable initialization sequence that is allowed and therefore triggers an enable signal is represented by the symbol D; activation of the command MODE-REGISTER-SET to logic LOW is allowed at any time after the activation of the POWERON signal.

Figure 4:
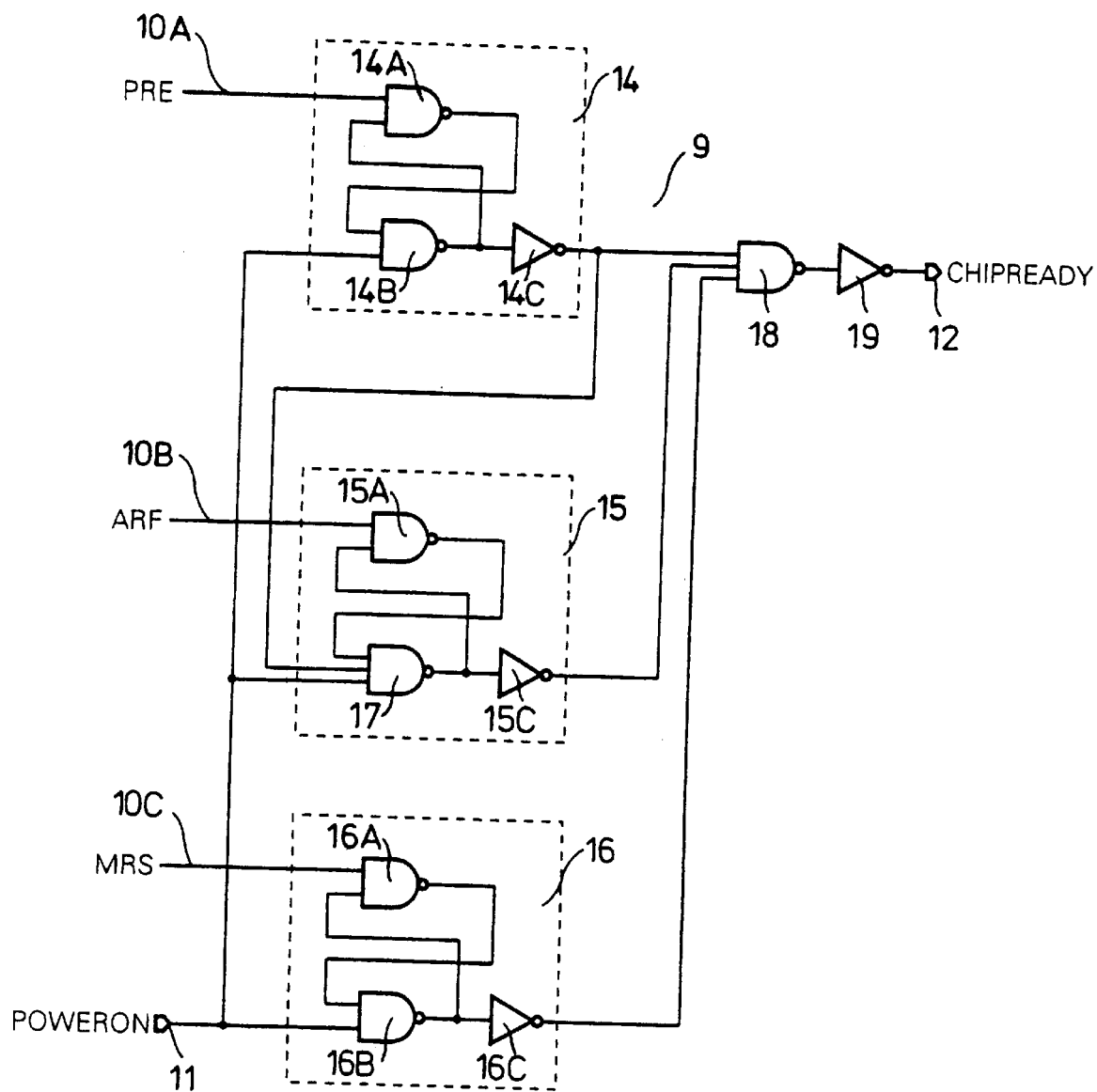
FIG. 4 is a circuit diagram of the enable circuit according to an exemplary embodiment of the invention.

FIG. 4 shows further details of a preferred exemplary embodiment of the enable circuit 9 according to the invention. In this exemplary embodiment, each of the bistable multivibrators 14, 15, 16 is constructed from in each case two NAND gates 14A, 14B, 15A, 17, 16A, 16B and also an inverter 14C, 15C and 16C, which are connected to one another in the manner illustrated. The NAND gate 17 is provided with three inputs in the bistable multivibrator 15.

I claim:

1. A dynamic semiconductor memory device of a random access type, comprising:

an initialization circuit controlling a switching-on operation and supplying a supply voltage stable signal once a supply voltage has been stabilized after the switching-on operation, said initialization circuit having a control circuit for controlling operations and an enable circuit receiving the supply voltage stable signal and externally applied further command signals, said enable circuit outputting an enable signal after a predetermined proper initialization sequence of the externally applied further command signals being identified and the enable signal effecting an unlatching of said control circuit.

2. The semiconductor memory device according to claim 1, wherein the externally applied further command signals forming the predetermined proper initialization sequence to be identified by said enable circuit includes at least one of a preparation command signal for word line activation, a refresh command signal, and a loading configuration register command signal.

3. The semiconductor memory device according to claim 1, wherein said enable circuit has at least one bistable multivibrator stage having a set input receiving the externally applied further command signals, a reset input receiving one of the supply voltage stable signal, a signal derived from the supply voltage stable signal and a linked signal, and an output outputting said enable signal.

4. The semiconductor memory device according to claim 3, wherein said at least one bistable multivibrator stage is a plurlity of bistable multivibrator stages respectively receiving one of the externally applied further command signals.

5. The semiconductor memory device according to claim 4, wherein said output of one of said plurality of bistable multivibrator stages is passed to said reset input of another of said plurality of bistable multivibrator stages.

6. The semiconductor memory device according to claim 4, including an AND gate receiving the supply voltage stable signal and a signal output from said output of one of said plurality of bistable multivibrator stages, said AND gate outputting an output signal received at said reset input of another of said plurality of bistable multivibrator stages.

7. The semiconductor memory device according to claim 4, wherein said plurality of bistable multivibrator stages are each formed of an RS flip-flop constructed from one of at least two NOR and at least two NAND gates.

8. The semiconductor memory device according to claim 1, wherein the identification of an initialization sequence that is identified as the predetermined proper initialization sequence by said enable circuit and generates the enable signal constitutes a command sequence conforming to a JEDEC standard.

9. The semiconductor memory device according to claim 1, wherein said control circuit has output drivers remaining latched during the switching-on operation until said enable signal is generated by said enable circuit.

10. The semiconductor memory device according to claim 1, wherein the predetermined proper initialization sequence includes one of the following chronologically successive command sequences:

a) firstly PRE, secondly ARF, thirdly MRS;
   b) firstly PRE, secondly MRS, thirdly ARF; and
   c) firstly MRS, secondly PRE, or thirdly ARF;

where,

PRE=the preparation command signal for word line activation,
   ARF=the refresh command signal, and
   MRS=the loading configuration register command signal.

11. An improved method for initializing a dynamic semiconductor memory device of a random access type via an initialization circuit controlling a switching-on operation of the dynamic semiconductor memory device and of its circuit components, the improvement which comprises:

supplying, via the initialization circuit, a supply voltage stable signal once a supply voltage has been stabilized after the switching-on operation of the dynamic semiconductor memory device; and supplying, via an enable circuit of the initialization circuit, an enable signal, the initialization circuit receiving the supply voltage stable signal and further command signals externally applied to the dynamic semiconductor memory device, after an identification of a predetermined proper initialization sequence of the further command signals the enable signal being generated and effecting an unlatching of a control circuit provided for a proper operation of the dynamic semiconductor memory device.

12. The method according to claim 11, which comprises providing at least one of a preparation command signal for word line activation, a refresh command signal, and a loading configuration register command signal as the further command signals.

13. The method according to claim 11, which comprises maintaining a latched condition of output drivers of the dynamic semiconductor memory device during the switching-on operation until the enable signal is generated by the enable circuit.

* * * * *